United States Patent [19]

Dunn

[11] 4,439,968
[45] Apr. 3, 1984

[54] PRE-STRESSED THERMAL PROTECTION SYSTEMS

[75] Inventor: Thomas J. Dunn, Pasadena, Tex.

[73] Assignee: The United States of America as represented by the Administrator of the National Aeronautics and Space Administration, Washington, D.C.

[21] Appl. No.: 418,137

[22] Filed: Sep. 15, 1982

[51] Int. Cl.³ .......................... E04B 1/74; B32B 9/04
[52] U.S. Cl. ...................................... 52/404; 52/506; 244/158 A
[58] Field of Search ................. 52/404, 506, 541; 244/158 A, 160

[56] References Cited

U.S. PATENT DOCUMENTS

| 5,091 | 5/1847 | Stewart | 52/541 X |
|---|---|---|---|
| 320,822 | 6/1885 | Simons | 52/541 |
| 4,037,751 | 7/1977 | Miller et al. | 52/404 X |
| 4,124,732 | 11/1978 | Leger | 244/158 A |
| 4,151,800 | 5/1979 | Dotts | 244/158 A |
| 4,220,685 | 9/1980 | Markow et al. | 52/404 X |
| 4,280,484 | 7/1981 | Mancosy | 52/506 X |
| 4,290,250 | 9/1981 | Kusenda | 52/404 |
| 4,379,381 | 4/1983 | Holcombe | 52/404 |
| 4,379,382 | 4/1983 | Sauder | 52/506 |

Primary Examiner—J. Karl Bell
Attorney, Agent, or Firm—Russell E. Schlorff; John R. Manning; Marvin F. Matthews

[57] ABSTRACT

A hexagonal protective and high temperature resistant system for the Space Shuttle Orbiter consists of a multiplicity of pockets formed by hexagonally oriented spacer bars 11 secured ot the vehicle substructure 12, a packing of low density insulating batt material 18 in each pocket, and a thin protective panel 19 of laterally resilient advanced carbon-carbon material surmounting the peripheral bars 11 and packing 18. Each panel 19 has three stepped or offset lips on contiguous edges, as M-1, M-2, M-3, the other three edges, as M-4, M-5, M-6, being non-stepped, i.e., flat so that complementary edges of abutting panels rest against the peripheral bars. At the center of each pocket is a fully insulated stanchion 15 secured to and connecting the substructure and panel for flexing the panel toward the substructure and thereby prestressing the panel and forcing the panel edges firmly against the spacer bars.

9 Claims, 4 Drawing Figures

PRE-STRESSED THERMAL PROTECTION SYSTEMS

DESCRIPTION

Origin of the Invention—Field of the Invention

The invention described herein was made by an employee of the United States Government and may be manufactured and used for the government of the United States for governmental purposes without the payment of any royalties thereon or therefor.

BACKGROUND OF THE INVENTION

The present invention relates to a thermal protection system, and more particularly to a reusable thermal protection system for a portion of the Space Shuttle Orbiter.

Space vehicles are subjected to increases in temperature during ascent and reentry. A heat shield is used to protect the metallic structure of the vehicle during such periods. During the early space programs, manned vehicles were used for single trips and the heat shields were formed of ablative material. However, with the advent of the Space Transportation System which used a Space Shuttle Orbiter designed to make numerous trips into space, it was necessary to develop a reusable thermal protection system. The Space Shuttle Orbiter is in some respects similar to a large airplane and consequently various areas of the vehicle are subject to varying surface temperature extremes. For example, the nose cone and leading edges of the wings are subject to the greatest heating and require a system which will provide protection for surface temperatures up to 2800° F. (1811° K.). A coated reinforced carbon-carbon composite material (RCC) has been found satisfactory for these areas. On the other hand, the cargo bay doors are subject to the least heating and only require a system which will provide protection for surface temperatures up to 700° F. (644° K.). It has been found that the flexible reusable surface insulation (FRSI) fully described in U.S. Pat. No. 4,151,800 is satisfactory for this area. The undersides of the wings and fuselage require a system which will provide protection for surface temperatures up to 2300° F. (1533° K.) while the sides of the fuselage only require protection for surface temperatures up to 1200° F. (922° K.). The high temperature system is known as high temperature resuable surface insulation (HRSI) and the low temperature system as low temperature reusable surface insulation (LRSI). Presently, ceramic tiles cut from rigidized blocks of highly refined, chemically pure, silica fibers are used for such systems. The material, known as LI-900, is manufactured by Lockheed Missle and Space Corporation. The tiles are attached to the orbiter by the attachment arrangement fully described in U.S. Pat. No. 4,124,733.

For areas around openings and other locations requiring greater mechanical strength, a denser, stronger silica material described in U.S. Pat. No. 3,952,082, and known as LI-2200, is used. In addition, a new fibrous refactory composite insulation material, described in U.S. Pat. No. 4,148,962, and known as FRCI, is being considered for use. The tiles of all three materials are coated with a reaction cured borosilicate glass coating made in accordance with U.S. Pat. No. 4,093,771. Further, the tiles are provided with a deposition of a silane to provide water repellency. However, the coating as well as the tile material itself is fragile and has a low impact resistance, and, therefore, is easily subject to damage. Also, the silane burns out, therefore the tile system must be refurbished between flights to repair damage and provide new water repellency.

An effort has been made to find other materials which have stronger surface properties, and require a minimum of refurbishment between flights. One approach is to use high temperature resistant resilient material, such as advanced carbon-carbon, as outer panels for the large high temperature area on the underside of the wings and fuselage. Since the thermal protection system of the Space Shuttle Orbiter experiences stresses from a wide variety of loading conditions, such as mechanical, aerodynamic, and vibro-acoustic, as well as extreme temperature variations, it is necessary that the panels used for thermal protection be of sufficient strength and attached to the substructure in such a manner as to be able to withstand the stresses and loads of space flight and that, at the same time, the system provide the required thermal properties without a weight penalty.

Consequently, an object of the present invention is to develop a thermal protection system of protective panels for the surfaces of the Space Shuttle Orbiter subject to high temperature, which will withstand the stresses and loads of repetitive space flights with a minimum of refurbishment.

Another object is to provide improved attaching means for a thermal protection system of protective panels in which the attachment means are insulated to minimize oxidation from heating.

A further object is to provide a thermal protection system of hexagonal protective panels.

Still another object is to improve the impact resistance and durability of the thermal protection system.

SUMMARY OF THE INVENTION

The reusable thermal protection system of the present invention is formed of a plurality of advanced carbon-carbon polygonal protective panels attached to the aluminum substructure of the vehicle through a mechanically attached insulated stanchion and a plurality of adhesively attached insulating spacer bars. Contiguous pockets co-extensive with the surface to be protected are formed. Batt insulation is packed in each pocket beween the stanchion and the peripheral spacer bars and a hexagonal carbon-carbon panel bears against each batt unit with its periphery tightly resting against the framework of surrounding spacer bars. The panels are initially, conically dished (convex outwardly), each having its periphery formed by three contiguous stepped lips, the intervening three edges being unstepped, i.e. flat. Insulated fastener means flex the panel laterally into substantially flat configuration, thereby prestressing the panel and pressing the peripheral edges thereof into firm contact with the spacer bars against which they rest. Due to the hexagonal pattern of the cover panels, no long, unbroken straight lines occur between the abutting edges of adjacent panels.

DETAILED DESCRIPTION OF THE PREFERRED EMBODIMENT

Figure 1:
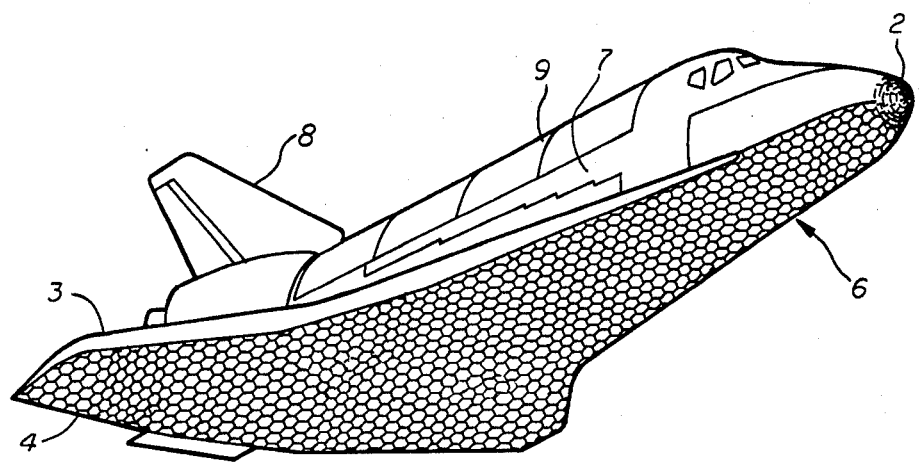
FIG. 1 is a perspective view of the Space Shuttle Orbiter viewed from the underside.

The Space Shuttle Orbiter, as shown in FIG. 1, is provided with various reusable thermal protection systems, according to heat resisting requirements. The nose cone 2 and leading edges 3 of the wings 4, are subject to the greatest amounts of heat on reentry and are protected by reinforced carbon-carbon. The bottoms of the fuselage and wings are subject to temperatures up to 2300° F. and are provided with the high temperature thermal protection of the present invention, generally designated 6. The sides 7 of the fuselage and the tail 8 are provided with low temperature reusable surface insulation. The cargo bay doors 9, subject only to temperatures up to 700° F., are provided with flexible, reusable surface insulation.

Figure 2:
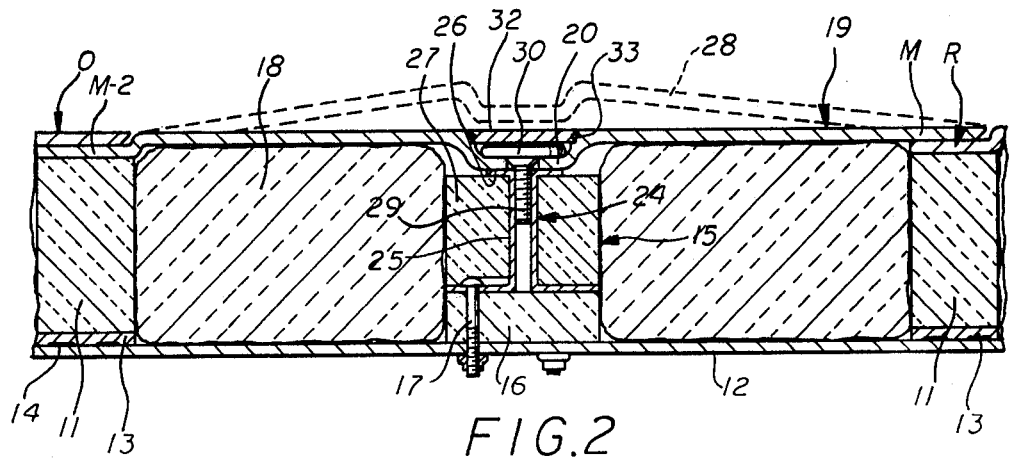
FIG. 2 is a transverse cross section of a portion of the thermal protection system of the present invention.

FIG. 2 illustrates in detail one of the numerous high temperature resistant units making up the protection system 6. At the edges of the unit are spacer bars 11 formed of FRCI-12 which are adhesively secured to the vehicle substructure 12 through thin strips of Nomex felt 13 by thin layers of RTV-560 adhesive 14. The spacer bars are disposed to form hexagonal pockets in the center of each of which there is an insulated stanchion 15 having a cylindrical base 16 of FRCI-12 mechanically attached to substructure 12. Extending above base 16 of the stanchion is a spool 24 of a high temperature resistant, super alloy, such as alloy 188. The spool stem 25 is surrounded by an annular plug 27 of high temperature resistant, ceramic insulation such as LI-900. Fasteners 17 extend through the base plate of spool 24, as well as base 16, to mechanically secure stanchion 15 to substructure 12. The pockets, between the side bars and stanchion, are packed with batt insulation 18 of low density, high heat resistant material, such as alumina-silica fibers, in nickel foil. Each batt is surmounted by a hexagonal protective panel 19 of advanced carbon-carbon having a depressed central hub portion 20.

Each protective panel 19 is formed of high temperature resistant, laterally resilient coated, twelve-ply, advanced carbon-carbon, the assembly having a final thickness of approximately 0.140 inch. The panel is initially formed in an upwardly convexed shallow conical or dished shape with hub 20 at its apex (dot dash lines 28). A fastener 29, extending through aligned bores in hub 20 and spool flange 26, has its shank threadedly engaging internal threads in spool stem 25. A broad head 30 engages hub 20 so that rotation of fastener 29 will draw hub 20 against stanchion 15 to flatten and prestress panel 19 and draw its peripheral edges tightly against spacer bars 11. In the installed position, the recess formed by hub 20 is closed by a disc 32 of advanced carbon-carbon, sealed in position flush with the surrounding panel by ceramic cement injected in an annular groove 33 about the disc. Such construction provides fastener 29 with some protection from the heat of reentry and slows down oxidation.

Figure 3:
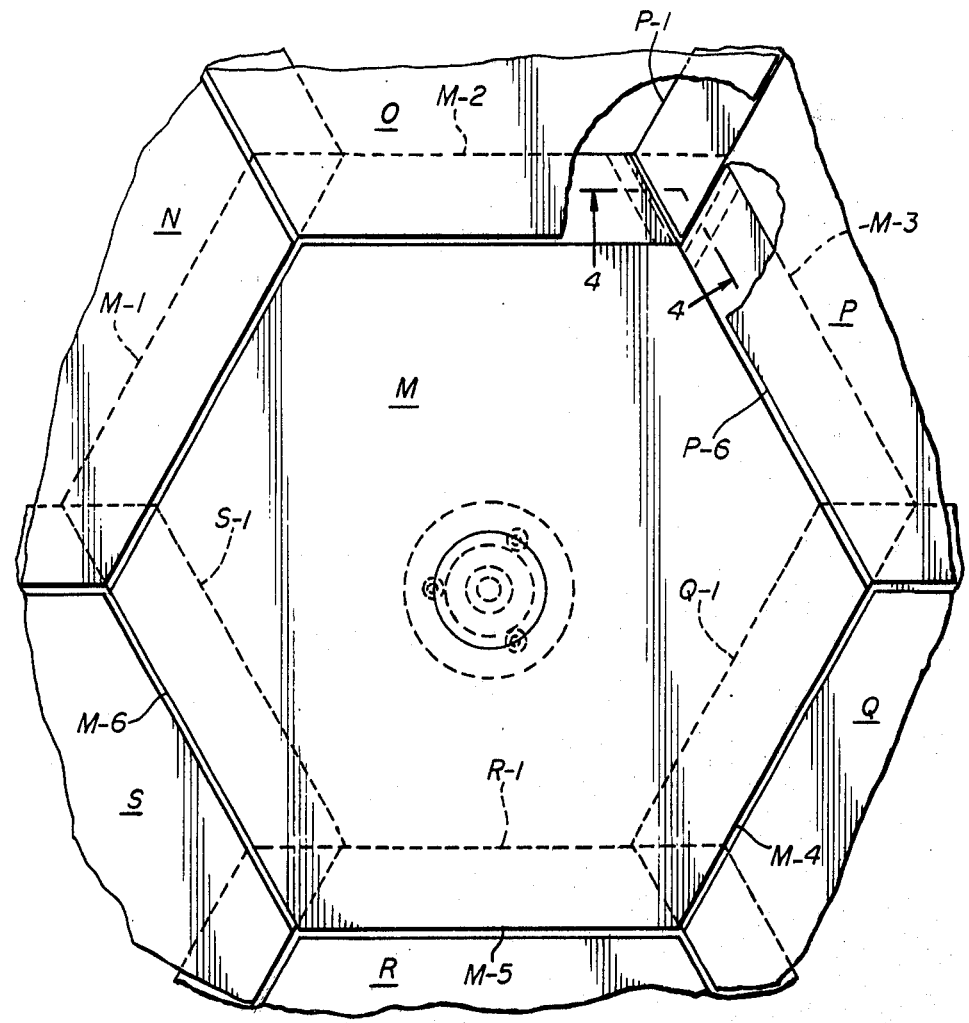
FIG. 3 is a plan view of a portion of the thermal protection system, parts being broken away to show underlying structure.
Figure 4:
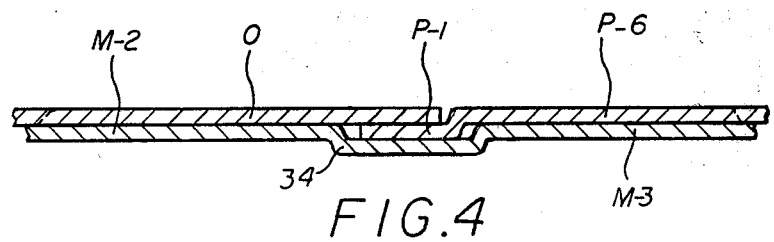
FIG. 4 is a detail section taken on broken line 4—4, of FIG. 3.

FIGS. 2, 3, and 4 illustrate the complementary mating edges of one protective unit M and six surrounding, contiguous, indentical units N, O, P, Q, R and S, whereby tight joints are formed between the hexagonal panels and spacer bars. Each panel has three stepped or offset edge lips, as M-1, M-2, and M-3, the other three edges, M-4, M-5, and M-6, being unstepped or flat and complementary to the offset lips. In the assembly, each stepped lip underlies an unstepped or flat abutting edge of an adjacent panel and the complementary overlapping lips rest firmly against the corresponding spacer bar. FIG. 4 shows the interleaved bar edges at one corner whereof. FIG. 3 shows portions of the protective panels O and P cut away to illustrate the relationship of the underlying lips. It is noted that the exposed corner of lip P-1 fits between lips M-2 and M-3 which are joined by the integral, offset gusset 34 below lip P-1 for support and aligment purposes. While the intersection between lips M-2 and M-3 and gusset 34 are ogee curves, as shown in FIG. 4, these curves appear as dotted lines in plan view FIG. 3, for simplicity. The arrangement of FIG. 4 is used wherever three panel lips come together in the system.

The installed panels are prestressed in bending, the fasteners in tension and the spacer bars in compression so that the edges of the panels remain in firm contact with overlapped edges of the adjacent panels. Moreover, the thickness, size and precurvature are sized so that the forces generated on lift-off will not overcome the preload.

It has been found that having the panels hexagonal in planform permits identically shaped panels to mesh together in a smooth array where each panel has the greatest possible ratio of area to circumference.

Accordingly, there is provided a thermal protection system for the Space Shuttle Orbiter which is weight competitive with the HRSI material presently used for the same purpose. The advanced carbon-carbon panels will provide a durable and impact resistant surface and smoother outer mold line with good maintainability and minimum turn around time and effort.

The exclusive use of all modifications as come within the scope of the appended claims is contemplated.

I claim:

1. A reusable high temperature, thermal protection system for a vehicle substructure comprising a plurality of spacer bars secured in pocket forming groups on the vehicle substructure, packing of low density insulation in each pocket, an outwardly dished protective panel of high temperature resistant, resilient material surmounting each pocket, and means flexing the central portion of each panel toward said substructure for prestressing each panel and pressing the periphery thereof firmly against the surrounding spacer bars.

2. A thermal protection system as described in claim 1 in which said flexing means comprises a stanchion mechanically connected to the substructure and includes threaded means for laterally flexing said panel.

3. A thermal protection system as described in claim 1 including a plurality of said panels forming a continuous surface and in which each of said panels is hexagonal whereby abuttments of said panels form nonstraight lines across the system.

4. A thermal protection system as described in claim 2 in which each of said panels is made of advanced carbon-carbon material.

5. A thermal protection system as described in claim 2 in which each of said panels is hexagonal and has three contiguous edges forming offset lips and the other three edges are flat forming overlapping abutting structure.

6. A thermal protection system as described in claim 4 including insulation material fully surrounding said stanchion.

7. A reusable thermal protection system for a substructure of a space vehicle comprising a plurality of groups of hexagonally arranged and pocket forming spacer bars secured to said substructure, laterally resilient, conical outer protective panels with edges resting against each of said groups of bars, three contiguous ones of said edge portions forming offset lips and the other three being flat for interfitting with complementary edges of abutting panels, a packing of low density matt insulation in each of said pockets and an insulated stanchion intermediately connecting each panel and said substructure and having means for centrally flexing each panel toward said substructure to prestress each panel and firmly press the edges thereto against said bars.

8. The thermal protection system set forth in claim 7 wherein the stanchion is mechanically attached to the substructure and the means flexing said panels is formed of a threaded fastener extending through the central portion of each panel and engaged with threaded means in the stanchion.

9. The thermal protection system set forth in claim 8 in which the head of the fastener is covered with high temperature resistant material.

* * * * *